United States Patent
Liu et al.

(10) Patent No.: US 9,490,273 B2
(45) Date of Patent: Nov. 8, 2016

(54) DISPLAY DEVICE COMPRISING A DIELECTRIC LAYER HAVING AN OPENING PARTIALLY EXPOSING A SEMICONDUCTOR LAYER AND A DATA LINE FILLING THE OPENING

(71) Applicant: InnoLux Corporation, Miao-Li County (TW)

(72) Inventors: Yu-Tsung Liu, Miao-Li County (TW); Te-Yu Lee, Miao-Li County (TW); Kuan-Yu Chiu, Miao-Li County (TW); Chao-Hsiang Wang, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 14/607,286

(22) Filed: Jan. 28, 2015

(65) Prior Publication Data

US 2016/0126254 A1 May 5, 2016

(30) Foreign Application Priority Data

Nov. 4, 2014 (TW) .............................. 103138139 A

(51) Int. Cl.
*H01L 27/12* (2006.01)
*H01L 27/32* (2006.01)
*G02F 1/1368* (2006.01)
*G02F 1/1362* (2006.01)

(52) U.S. Cl.
CPC ........... *H01L 27/124* (2013.01); *G02F 1/1368* (2013.01); *G02F 1/136286* (2013.01); *H01L 27/1222* (2013.01); *H01L 27/1225* (2013.01); *H01L 27/3276* (2013.01)

(58) Field of Classification Search
CPC .................................................. H01L 27/1222
See application file for complete search history.

(56) References Cited

U.S. PATENT DOCUMENTS

| 9,178,074 B2 | 11/2015 | Terai et al. | |
| 2006/0001789 A1* | 1/2006 | Ahn | G02F 1/133345 349/42 |
| 2009/0009704 A1* | 1/2009 | Tomikawa | G02F 1/134363 349/141 |
| 2011/0220894 A1* | 9/2011 | Furukawa | H01L 21/0335 257/57 |

FOREIGN PATENT DOCUMENTS

TW 201438253 10/2014

OTHER PUBLICATIONS

Taiwanese language office action dated May 10, 2016, issued in application No. TW 103138139.

* cited by examiner

*Primary Examiner* — Paul Lee
(74) *Attorney, Agent, or Firm* — McClure, Qualey & Rodack, LLP

(57) ABSTRACT

A display device includes a first substrate and an insulating layer over the first substrate. The display device further includes a semiconductor layer over the insulating layer and a dielectric layer over the semiconductor layer, having an opening partially exposing the semiconductor layer and the insulating layer, wherein the opening has a first width along a first direction. In addition, the display device further includes a conductive line extending over the dielectric layer along a second direction that is different from the first direction and filling the opening to electrically connect to the semiconductor layer exposed by the opening. The conductive line includes a first portion over a top surface of the dielectric layer and a second portion in the opening. The first portion of the conductive line has a second width along the first direction. The first width is greater than the second width.

13 Claims, 9 Drawing Sheets

DISPLAY DEVICE COMPRISING A DIELECTRIC LAYER HAVING AN OPENING PARTIALLY EXPOSING A SEMICONDUCTOR LAYER AND A DATA LINE FILLING THE OPENING

CROSS REFERENCE TO RELATED APPLICATIONS

This Application claims priority of Taiwan Patent Application No. 103138139, filed on Nov. 4, 2014, the entirety of which is incorporated by reference herein.

BACKGROUND OF THE INVENTION

1. Field of the Invention

The present invention relates to display devices, and in particular to an array substrate for display devices.

2. Description of the Related Art

In order to fulfill the requirements of high-speed image processing and high-quality image displays, flat-panel displays, such as color liquid-crystal displays (LCDs) have become popular. LCDs typically have an upper and a lower substrate with electrodes thereon. These substrates are sealed with adhesive materials, and a liquid-crystal material is sealed between these two substrates. Prior to liquid-crystal injection, spacers are sprayed between the substrates in order to maintain a constant distance therebetween.

Thin film transistors (TFTs) are typically formed above the lower substrate as switching devices. Each TFT has a gate electrode connected to a scanning line, a source electrode connected with a data line, and a drain electrode connected to a pixel electrode. The upper substrate is disposed above the lower substrate and includes a color filter and a plurality of light-shielding materials (formed of e.g. resin black matrix). Edges of the lower and upper substrates are sealed with adhesive materials, and liquid-crystal materials are provided between the upper and lower substrates. The lower substrate is also called a first substrate, and elements such TFTs and electrical contacts are formed thereover, which are typically defined by performing several photolithography steps.

However, as improvements are made in the image resolution of display devices, display devices for maintaining or improving the performance of light transmittance and image display of display devices are needed, especially as the size of the elements such as TFTs and contacts formed over the lower substrate is further reduced.

BRIEF SUMMARY OF THE INVENTION

An exemplary display device comprises a first substrate and an insulating layer over the first substrate. The display device further comprises a semiconductor layer over the insulating layer and a dielectric layer over the semiconductor layer, having an opening partially exposing the semiconductor layer and the insulating layer, wherein the opening has a first width along a first direction. In addition, the display device further comprises a conductive line extending over the dielectric layer along a second direction which is different from the first direction and filling the opening to electrically connect the semiconductor layer exposed by the opening. The conductive line comprises a first portion over a top surface of the dielectric layer and a second portion in the opening. The first portion of the conductive line has a second width along the first direction, and the first width is greater than the second width.

Another exemplary display device comprises a first substrate and an insulating layer over the first substrate. The display device further comprises a dielectric layer over the insulating layer, having an opening partially exposing the insulating layer, and a trench formed in the insulating layer, connecting with the opening. In addition, the display device further comprises a conductive line over the opening and in the trench to cover the insulating layer exposed by the opening and the trench and to partially cover the sidewall of the dielectric layer exposed by the opening.

An exemplary display device comprises a first substrate as described in one of the above exemplary first substrate, a second substrate, and a display layer disposed between the second substrate and the first substrate.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
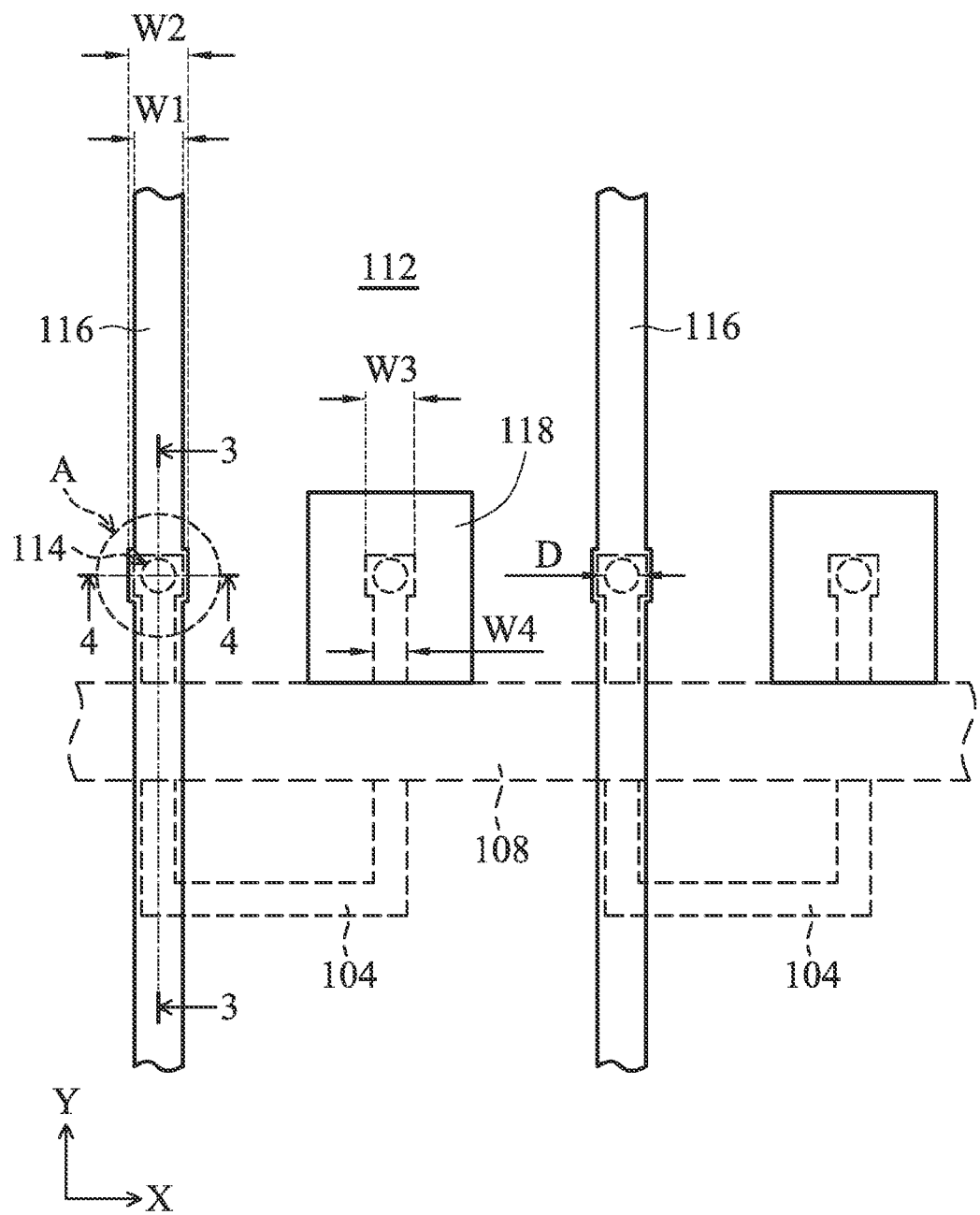
FIG. 1 is a schematic top view showing the layout of a first substrate according to a comparative embodiment of the invention.
Figure 2:
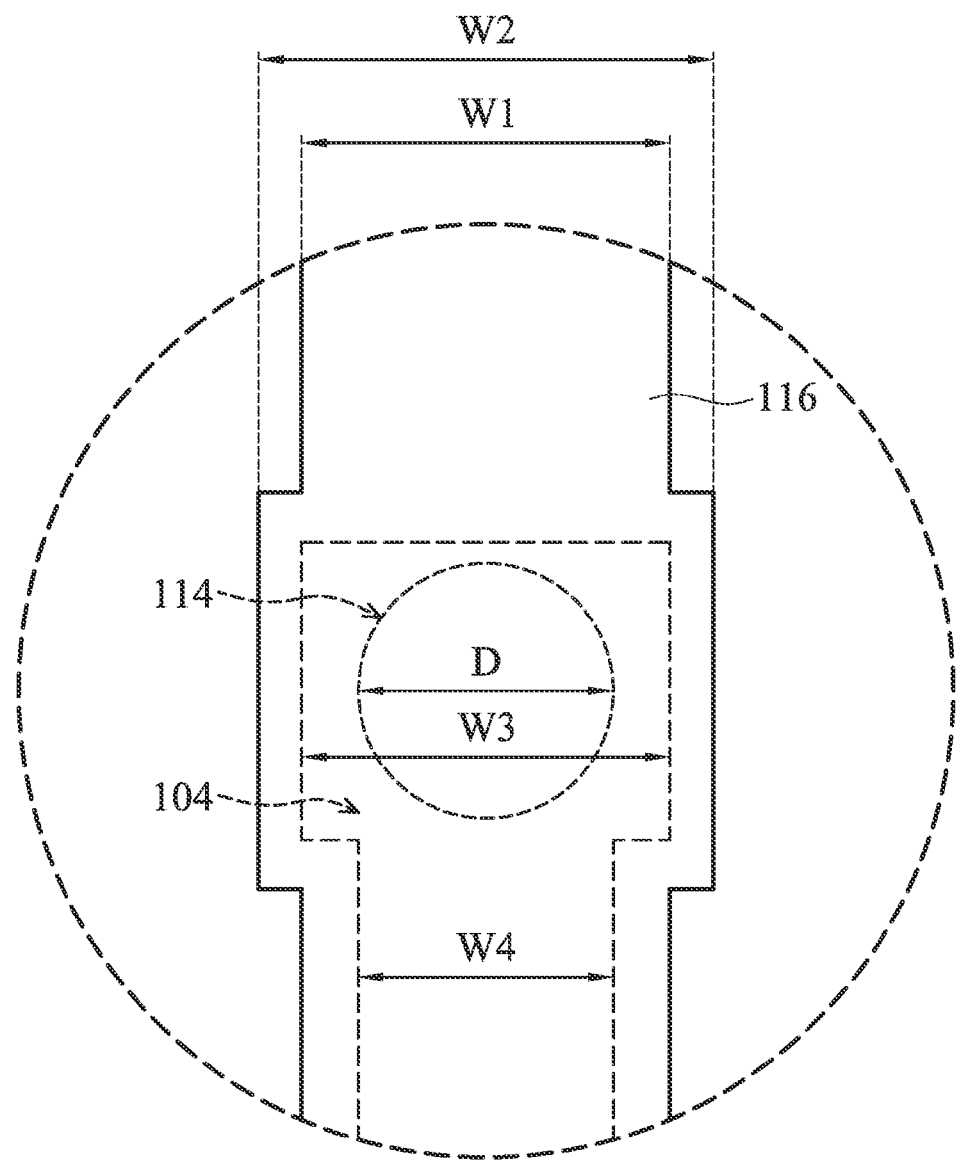
FIG. 2 is a schematic view showing an enlargement of area A in FIG. 1.
Figure 3:
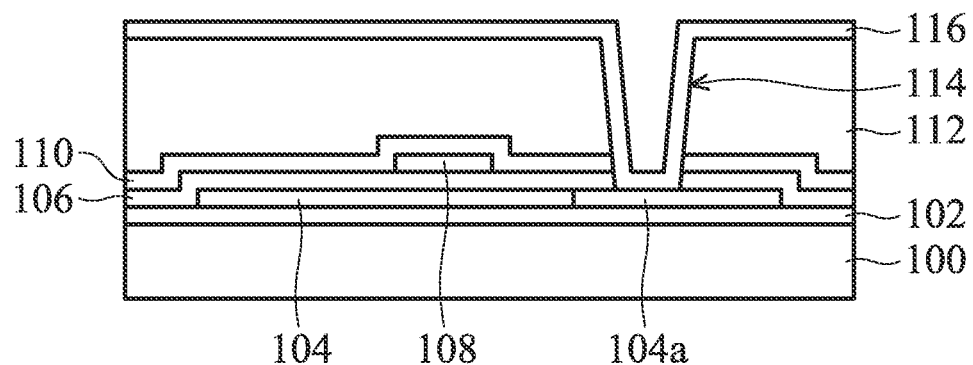
FIG. 3 is a schematic view showing a cross section of the first substrate along the line 3-3 in FIG. 1.

FIGS. 1-3 are schematic diagrams showing a first substrate according to a comparative embodiment of the invention. Herein, the first substrate shown in FIGS. 1-3 is an array substrate known by the inventors which describes undesirable electrical and display performances such as reductions of aperture ratio and contrast, and disconnection of the data lines found by the inventors as the trend of size reduction of the elements, for example TFTs and conductive contacts, formed over the first substrate continues.

FIG. 1 is schematic top view showing the layout of a first substrate according to a comparative embodiment of the invention. Herein, the first substrate mainly comprises a substrate 100 (not shown here, but shown in FIGS. 2-3) and a plurality of U-shaped semiconductor layers 104 formed separately over the substrate 100. A first conductive line 108 extends over the substrate 100 along a first direction such as the X direction, partially covering portions of the semiconductor layers 104. A second dielectric layer 112 is formed over the substrate 100, the semiconductor layer 104, and the first conductive line 108. A plurality of second conductive lines 116 extend over the dielectric layer 112 along a second direction such as the Y direction, partially covering a portion of one of the semiconductor layers 104. A metal layer 118 is formed over another portion of the second dielectric layer 112 between the two adjacent second conductive lines 116 to partially cover another portion of the semiconductor layer. A plurality of openings 114 are separately disposed in the second dielectric layer 112 to respectively expose the top surfaces of a plurality of portions of the semiconductor layers 104, and a portion of the second conductive line 116 and the metal line 118 respectively fill one of the openings 114, thereby forming electrical connections with the semiconductor layers 104.

As shown in FIG. 1, the first conductive lines 108 extending along the first direction such as the X direction may function as the gate lines, the second conductive lines 116 extending along the second direction such as the Y direction may function as the data lines, the openings 114 may function as contact hole, and a portion of the second conductive line 116 and the metal layer 118 formed in the openings 114 is formed as an electrical connection element. Herein, the first conductive line 108 may have a substantially uniform line width, and the second conductive lines 116 may have two non-uniform line widths W1 and W2, wherein the line width W2 is greater than the line width W1. Each of the line widths W1 and W2 are greater than the width D of the openings 114 defined along the first direction, and the width D is the maximum width of the openings 114. In addition, the semiconductor layer 104 underlying the opening 114 may have two non-uniform line widths W3 and W4, and the line width W3 is greater than the line width W4, and the line width W3 is greater than the width D of the openings 114 along the first direction, and the line width W4 is equal to the width D of the opening 114 along the first direction. The portion of second conductive lines 116 not adjacent to the opening 114 may have the greater line width W2. Through such a non-uniform line width configuration, it is ensured that the second conductive line 116 can be fully filled over the surfaces of the second dielectric layer 112 and the semiconductor layer 104 exposed by the opening 114, thereby forming and ensuring the electrical connection between the second conductive line 116 and the semiconductor layer 104. FIG. 2 is shows an enlargement of area A in FIG. 1 to clearly show the relative configurations of the line widths W1 and W2 of the second conductive lines 116, the maximum width D of the opening 114, and the line widths W3 and W4 of the semiconductor layer 104 underlying the opening 114.

Figure 4:
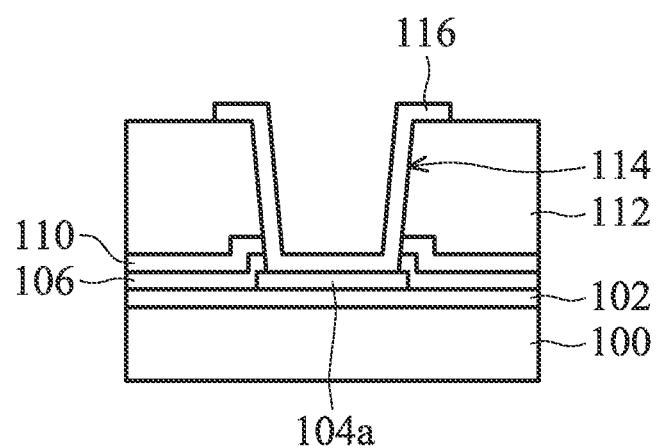
FIG. 4 is a schematic view showing a cross section of the first substrate along the line 4-4 in FIG. 1.

FIGS. 3 and 4 are schematic views showing cross sections of the first substrate along the line 3-3 and the line 4-4 in FIG. 1 according to a comparative embodiment of the invention, respectively.

As shown in FIGS. 3-4, a first insulating layer 102 is further formed between the semiconductor layer 104 and the substrate 100 to function as a buffer layer between the substrate 100 and the semiconductor layer 104, and the semiconductor layer 104 is formed over the first insulating layer 102. In addition, a second insulating layer 106 is further formed between the first conductive line 108 and the semiconductor layer 104 to function as a gate insulating layer, and a first dielectric layer 110 is further formed between the second dielectric layer 112 and the first conductive line 108. The opening 114 penetrates a portion of the first dielectric layer 110 and the second insulating layer 106, such that it partially exposes a source region 104a in the semiconductor layer 104. The second conductive line 116 is also formed over surfaces of the second dielectric layer 112 and the second insulating layer 106 exposed by the opening 114. In addition, as shown in FIGS. 3-4, the second conductive line 116 is in physical contact with the top surface of the source region 104a in the semiconductor layer 104 such that an electrical connection is formed therebetween.

As shown in FIGS. 3-4, film layers of the substrate 100, the semiconductor layer 104, the second insulating layer 106 and the conductive layer 108 are formed as a top-gate transistor device configuration, but the first substrate of the invention is not limited thereto.

Figure 5:
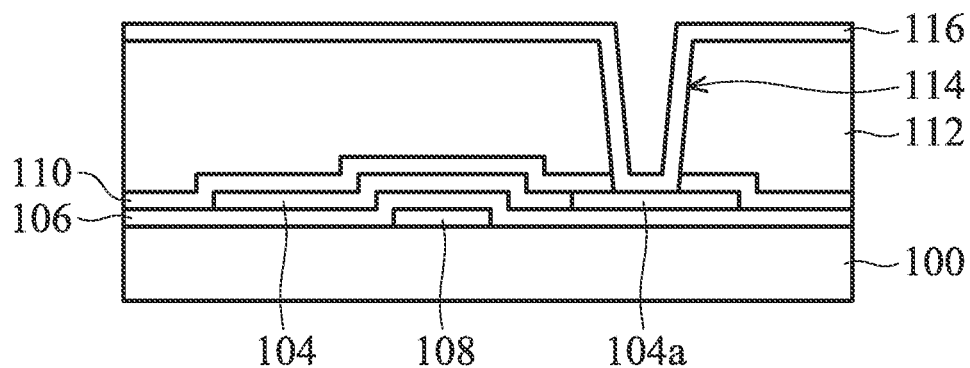
FIG. 5 is a schematic view showing a cross section of the first substrate along the line 3-3 in FIG. 1 according to another comparative embodiment of the invention.
Figure 6:
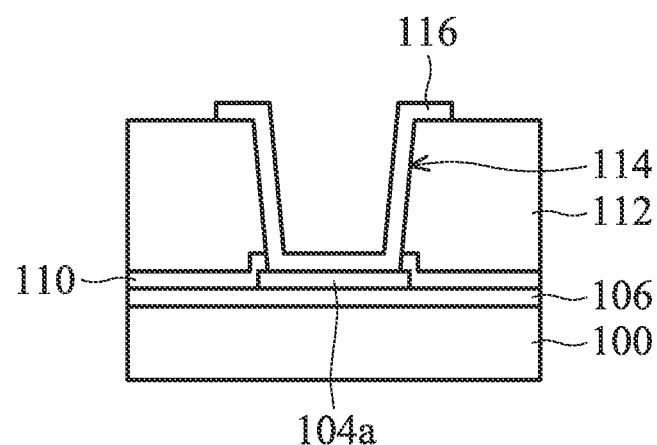
FIG. 6 is a schematic view showing a cross section of the first substrate along the line 4-4 in FIG. 1 according to another comparative embodiment of the invention.

FIGS. 5-6 are schematic views showing cross sections of the first substrate along the line 3-3 and the line 4-4 in FIG. 1 according to another comparative embodiment of the invention. Herein, film layers of the substrate 100, the semiconductor layer 104, the second insulating layer 106 and the conductive layer 108 are formed as a bottom-gate transistor device configuration, thereby having cross sections that are different from those shown in FIGS. 3-4. However, as shown in FIGS. 5-6, use of the insulating layer 102 can be omitted, such that the first conductive layer 108 can be directly formed over a portion of the substrate 100, and the second insulating layer 106 is formed over the substrate 100 and the first conductive line 108. The semiconductor layer 104 is formed over a portion of the insulating layer 106, and the first dielectric layer 110 and the second dielectric layer 112 are sequentially formed over the semiconductor layer 104 and the second insulating layer 106, and the opening 114 penetrates the first dielectric layer 110 and the second dielectric layer 112 to partially expose the top surface of the semiconductor layer 104, such as the top surface of the source region 104a in the semiconductor layer 104, and the second conductive line 116 is also formed over the surfaces of the first dielectric layer 110 and the second dielectric layer 112 exposed by the opening 114. Herein, the top view of the first substrate as shown in FIGS. 5-6 are the same as the top view of the first substrate shown in FIG. 1 and is not described again here for the purpose of brevity.

However, as the trend of the size reduction of elements such as TFTs and conductive contacts formed over the first substrate continues, the second conductive line 116 in the opening 114 shown in FIGS. 1-6 may suffer from peeling, and the configuration of the second conductive line 116 having widths W1 and W2 is not helpful for increasing display performances such as the aperture ratio and the contrast of each pixel in the display element, thereby affecting performance such as light-transmittance and image displaying of a display device comprising the first substrate shown in FIGS. 1-6.

Accordingly, an improved first substrate is provided to maintain or increase performance such as light-transmittance and image displaying of the display device as the trend of the size reduction of the elements such as TFTs and conductive contacts formed over the first substrate continues.

FIGS. 7-12 are schematic diagrams showing a first substrate according to an embodiment of the invention. Herein, the first substrate shown in FIGS. 7-12 is obtained by modifying the first substrate shown in FIGS. 1-6. Therefore, the same reference numbers in FIGS. 7-12 represent the same components and differences therebetween are discussed as follows.

Figure 7:
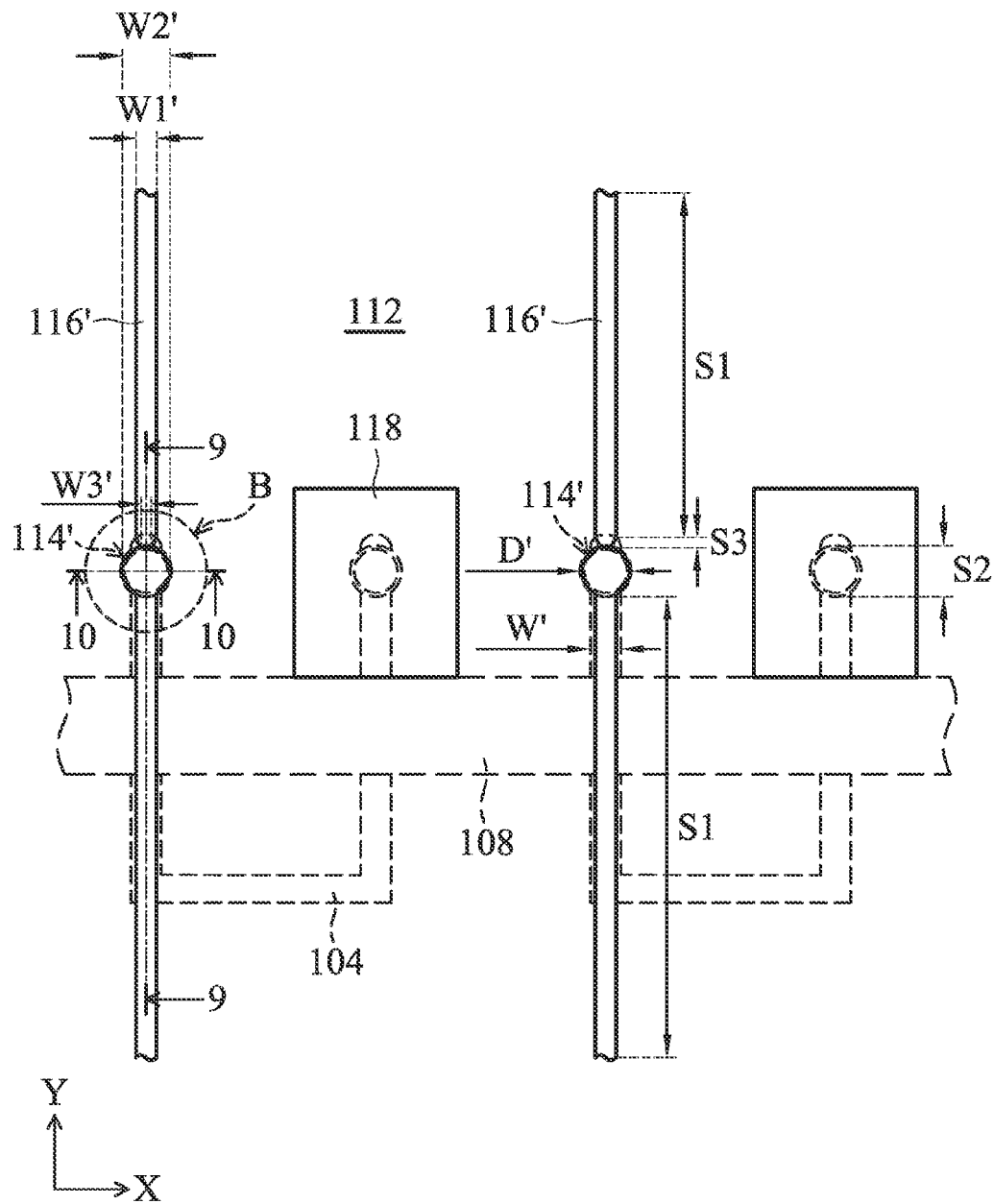
FIG. 7 is a schematic top view showing the layout of an first substrate according to an embodiment of the invention.

In FIG. 7, the first substrate mainly comprises a substrate 100 (not shown here, please see FIGS. 9-10) and a plurality of U-shaped semiconductor layers 104 formed separately over the substrate 100. A first conductive line 108 extends over the substrate 100 along a first direction such as the X direction, partially covering portions of the semiconductor layers 104. A second dielectric layer 112 is formed over the substrate 100, the semiconductor layer 104, and the first conductive line 108. A plurality of second conductive lines 116' are separately formed over the second dielectric layer 112 and extend along a second direction such as the Y direction, partially covering a portion of one of the semiconductor layers 104. A metal layer 118 is formed over another portion of the second dielectric layer 112 between the two adjacent second conductive lines 116', and a plurality of openings 114' are separately disposed in the second dielectric layer 112 to respectively expose the top surface of a plurality of portions of the second insulating layer 106 (not shown here, please see FIGS. 7-8). A portion of the conductive line 116' and a portion of the metal line 118 each fill in one of the openings 114', thereby forming electrical connections with the semiconductor layer 104.

Figure 8:
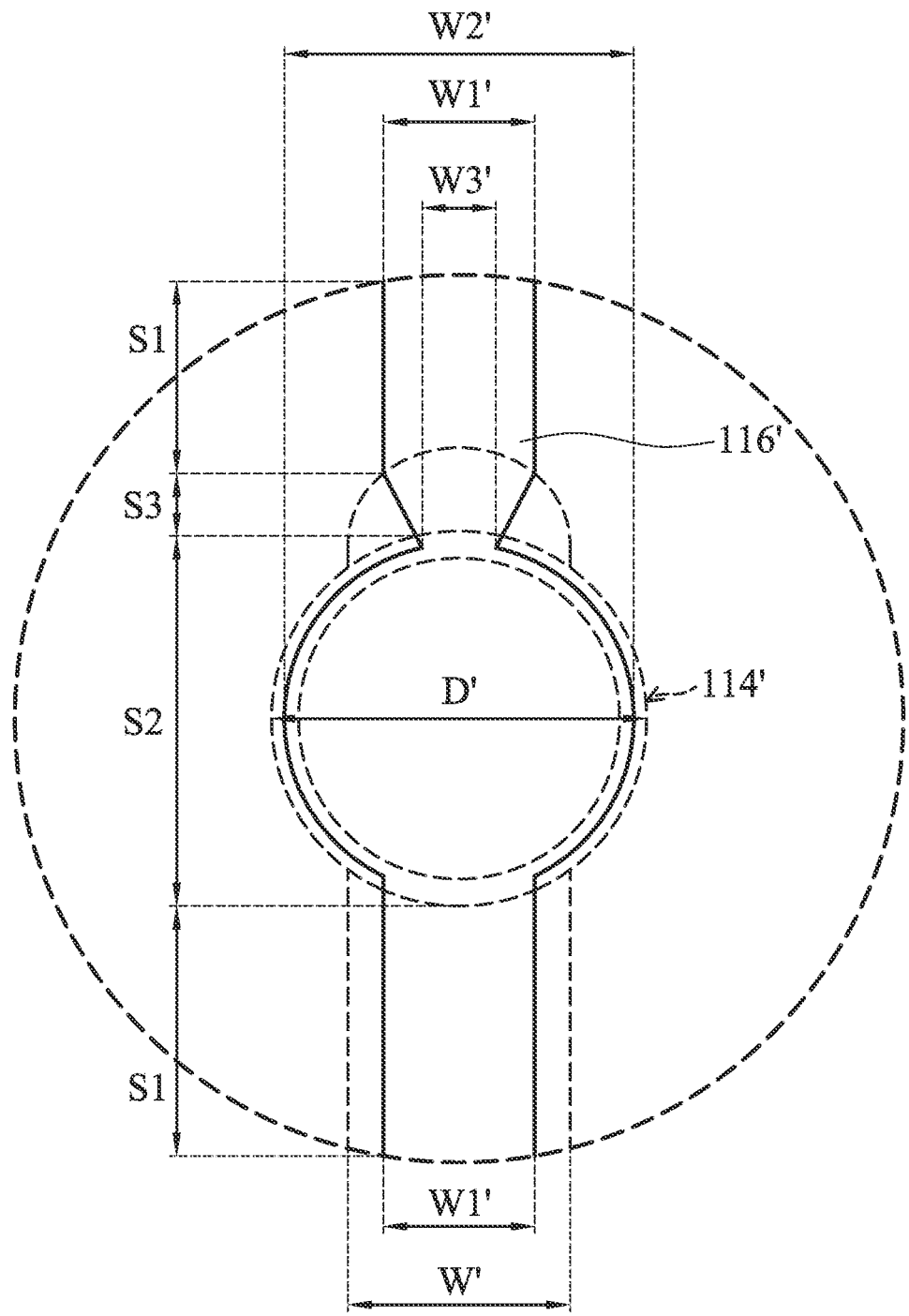
FIG. 8 is a schematic view showing an enlargement of area B in FIG. 7.

As shown in FIG. 7, the first conductive line 108 extending along the first direction such as the X direction may function as the gate line, and the second conductive lines 116' extending along the second direction such as the Y direction may function as data lines. The openings 114' may function as contact holes, and a portion of the second conductive line 116' and a portion of the metal layer 118 formed in the openings 114' may function as electrical connection elements. Herein, the first conductive line 108 may have a substantially uniform line width, and the second conductive lines 116 may have three non-uniform line widths W1', W2' and W3', wherein the line width W2' is greater than the line width W1' and the line width W1' is greater than the line width W3'. Each of the line widths W1', W2' and W3' are less than the width D' of the opening 114' along the first direction, and the width D' is the maximum width of the opening 114. In addition, the semiconductor layer 104 may have a uniform line width W' that is less than the width D' of the opening 114', and the edge of the semiconductor layer 104 may have a rounded corner structure (see FIG. 8). The second conductive line 116' may comprise a first portion S1 having a line width W1' formed over the second dielectric layer 112, a second portion S2 having a line width W2' formed in the opening 114', and a third portion S3 having a line width W3' formed over the second dielectric layer 112 and being adjacent to the opening 114'. Through such a non-uniform line width configuration, it is ensured that the second conductive line 116' is merely formed over the portion of the second dielectric layer 112 adjacent to the opening 114' and partially fills the opening 114' and covers the second dielectric layer 112 exposed by the opening 114' such that it electrically connects with the semiconductor layer 104 exposed by the opening 114' and ensures the electrical connections between the second conductive line 116' and the semiconductor layer 104. FIG. 8 shows an enlargement of area B in FIG. 7 to clearly show the relative configurations of the line widths W1', W2' and W3' of the first portions S1, S2, and S3 of the second conductive lines 116'. It also shows the line width W' of the semiconductor layer 104 and the width D' of the opening 114. As shown in FIG. 8, one end of the second portion S2 having the line width W2' in the opening 114' is connected with the first portion S1 having the line width W1' over the second dielectric layer 112 through the third portion S3 having the line width W3' formed over the second dielectric layer 112. The other end of the second portion S2 having the line width W2' in the opening 114' is directly connected with the portion S1 having the line width W1' formed over the second dielectric layer 112.

Figure 9:
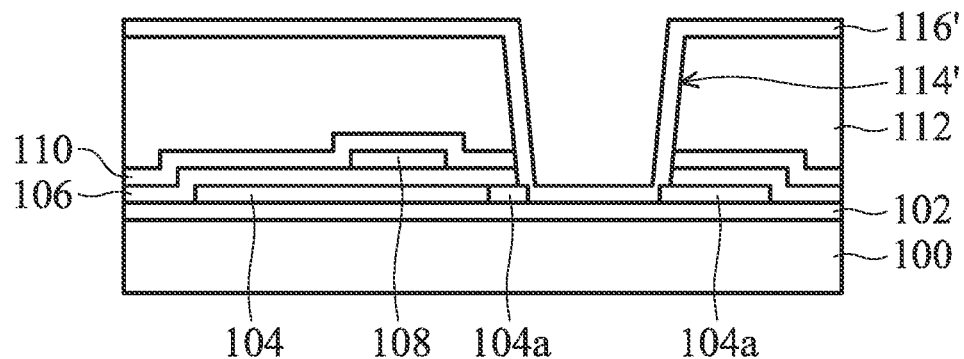
FIG. 9 is a schematic view showing a cross section of the first substrate along the line 9-9 in FIG. 7.
Figure 10:
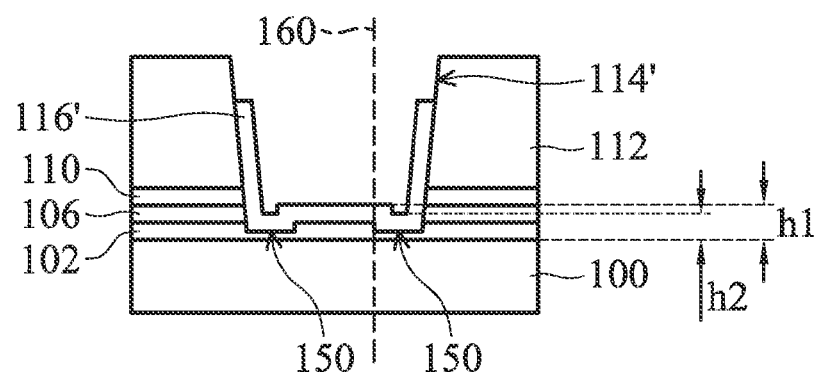
FIG. 10 is a schematic view showing a cross section of the first substrate along the line 10-10 in FIG. 7.

FIGS. 9 and 10 are schematic views showing cross-sectional views of the first substrate along line 9-9 and line 10-10 respectively in FIG. 7 according to an embodiment of the invention.

As shown in FIGS. 9-10, a first insulating layer 102 is further formed between the semiconductor layer 104 and the substrate 100 to function as a buffer layer between the substrate 100 and the semiconductor layer 104. The semiconductor layer 104 is formed over a portion of the first insulating layer 102. In addition, a second insulating layer 106 is further disposed between the first conductive line 108 and the semiconductor layer 104 to function as a gate insulating layer. A first dielectric layer 110 is further formed between the second dielectric layer 112 and the first conductive line 108. As shown in FIG. 9, the opening 114' may have a tapered configuration having a reduced size from top to bottom, and it not only penetrates a portion of the first dielectric layer 110 and the second insulating layer 106, but it also penetrates the semiconductor layer 104 to expose a source region 104a in the semiconductor layer 104, thereby exposing the top surface and sidewall surfaces of a portion of the source region 104a in the semiconductor layer 104 and a top surface of the first insulating layer 102, such that the second conductive line 116' is also formed over surfaces of the second dielectric layer 112, the second insulating layer 106, the semiconductor layer 104 and the first insulating layer 102 exposed by the opening 114'. In addition, as shown in FIG. 9, the second conductive line 116' physically contacts a portion of the top surface and the sidewall surface of the source region 104a in the semiconductor layer 104 but does not only contacts the top surface of the semiconductor layer 104, thereby forming electrical connections between the source region 104a in the semiconductor layer 104. As shown in FIG. 10, the portion of the source region 104a in the semiconductor layer 104 exposed by the opening 114' is removed and is not shown in FIG. 10, and a plurality of trenches 150 are formed in the first insulating layer 102 adjacent to the source region 104a in the semiconductor layer 104 exposed by the opening 114', and the second conductive line 116' is also formed over the top surface and the sidewall surfaces of the first insulating layer 102 exposed by the trenches 150. Therefore, the distance h1 between the substrate 100 and the top surface of the first insulating layer 102 exposed by the opening 114' is greater than the distance h2 between the substrate 100 and the second conductive line 116' formed over the top surface of the first insulating layer 102. A gap is formed between the top surface of the first insulating layer 102 exposed by the opening 114' and the top surface of the first insulating layer 102 exposed by the trenches 150, and the gap further comprises an interface 160 (illustrated as dotted lines) of a step-like gap.

As shown in FIGS. 9-10, film layers of the substrate 100, the semiconductor layer 104, the second insulating layer 106 and the conductive layer 108 are formed as a top-gate transistor device configuration, but the first substrate of the invention is not limited thereto.

Figure 11:
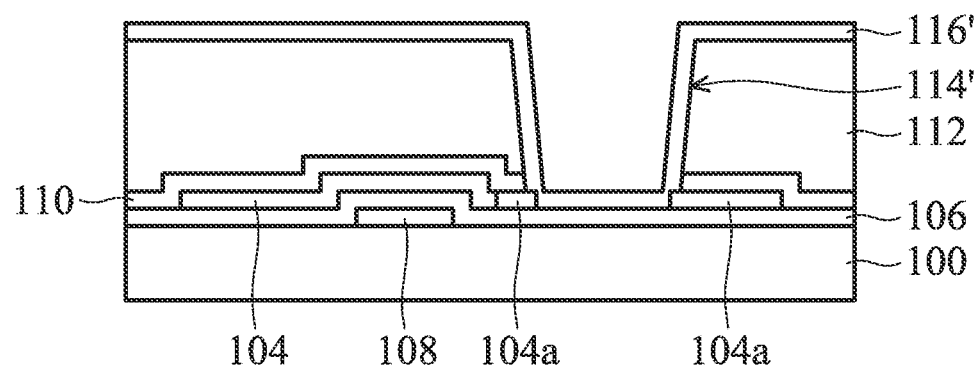
FIG. 11 is a schematic view showing a cross section of the first substrate along the line 9-9 in FIG. 7 according to another embodiment of the invention.
Figure 12:
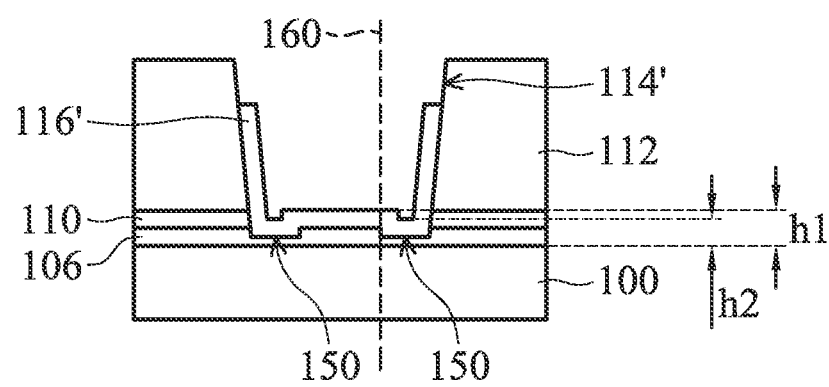
FIG. 12 is a schematic view showing a cross section of the first substrate along the line 10-10 in FIG. 7 according to another embodiment of the invention.

FIGS. 11-12 are schematic views showing cross sections of the first substrate along the line 9-9 and line 10-10 in FIG. 7 according to another embodiment of the invention. Herein, film layers of the substrate 100, the semiconductor layer 104, the second insulating layer 106 and the conductive layer 108 are formed as a bottom-gate transistor device configuration, thereby having cross-sectional views that are different from those shown in FIGS. 9-10. However, as shown in FIGS. 11-12, the insulating layer 102 can be omitted, and the first conductive layer 108 can be directly disposed over a portion of the substrate 100, and the second insulating layer 106 is disposed over the substrate 100 and the first conductive line 108, and the semiconductor layer 104 is disposed over a portion of the insulating layer 106, and the first dielectric layer 110 and the second dielectric layer are sequentially disposed over the semiconductor layer 104 and the second insulating layer 106. Herein, the opening 114' not only penetrates the first dielectric layer 110 and the second dielectric layer 112, but it also penetrates the semiconductor layer 104 and exposes the top surface and sidewall surface of the source region 104a in the semiconductor layer 104, such that the second conductive layer 116' is also formed over the surfaces of the second dielectric layer 112, the first dielectric layer 110 and the second dielectric layer 112, the second insulating layer 106, and the semiconductor layer 104 exposed by the opening 114'. In addition, as shown in FIG. 11, the second conductive line 116' physically contacts a portion of the top surface and sidewalls of a portion of the source region 104a in the semiconductor layer 104 but does not only contact the top surface of the portion of the semiconductor layer 104, thereby forming electrical connections with the source region 104a in the semiconductor layer 104. As shown in FIG. 12, the portion of the semiconductor layer 104 exposed by the opening 114' is removed and is not shown in FIG. 12, and a plurality of trenches 150 are formed in portions of the second insulating layer 106 adjacent to the source region 104a in the semiconductor layer 104 adjacent to the opening 114', and the second conductive line 116 is also formed in the top surface and sidewall surfaces of the second insulating layer 106 exposed by the trench 150. Accordingly, the distance h1 between the substrate 100 and the top surface of the second insulating layer 106 exposed by the opening 114' is greater than the distance h2 between the substrate 100 and the second conductive line 116' formed over the top surface of the second insulating layer 106. A gap is formed between a top surface of the second insulating layer 106 exposed by the opening 114' and the top surface of the second insulating layer 106 exposed by the trenches 150, and it further comprises an interface 160 (illustrated as dotted lines) of a step-like gap. Herein, the top view of the first substrate as shown in FIGS. 11-12 are the same with the top view of the first substrate shown in FIG. 7 and is not described again here for the purpose of brevity.

In one embodiment, as the width D' of the opening 114' shown in FIGS. 7-12 is the same with the width D of the opening 114 shown in FIGS. 1-6, in the several embodiments of the first substrate shown in FIGS. 7-12, through the formation of the second conductive line 116 and the opening 114', the line width of the second conductive lines 116' can be further reduced when compared with the first substrates shown in FIGS. 1-6. Since the three line widths W1', W2' and W3' are less than the maximum width D' of the opening 114, the aperture ratio and contrast of the pixel in the display element can be increased further. Moreover, in the embodiments of the first substrates shown in FIGS. 10 and 12, the portion of the second conductive line 116' formed in the opening 114' extends downward into a portion of the first insulating layer 102 or a second insulating layer 106 underlying the semiconductor layer 104, and it contacts both the top surface and the sidewall surface of the semiconductor layer 104 but not only merely contacts the top surface thereof for forming a contact structure, thereby further ensuring adhesion of the second conductive line 116' in the opening 114' and increasing a contact area between the second conductive line 116' and the semiconductor layer 104. This is helpful to improve contact performances and contact resistances between the data line and the semiconductor layer in each pixel of the display elements, and would not suffer peeling that may occur in the configuration having the second conductive line 116 in the opening 114 as shown in FIGS. 1-6.

In the embodiments shown in FIGS. 1-6 and FIGS. 7-12, the substrate 100 may comprise materials such as glass or plastic, and the first insulating layer 102 may comprise materials such as silicon oxide, silicon nitride, or combinations thereof, and the semiconductor layer 104 may comprise materials such as polysilicon, and the first insulting layer 106 may comprise materials such as silicon oxide, the first conductive line may comprise materials such as tungsten or aluminum, and the first dielectric layer 110 and the second dielectric layer 112 may comprise different materials such as silicon oxide or silicon nitride, and the second conductive lines 116, 116' and the metal line 118 may comprise materials such as tungsten and aluminum and can be formed simultaneously. Fabrication of the above components can be achieved by conventional first substrate fabrications and are not described here for the purpose of simplicity.

Figure 13:
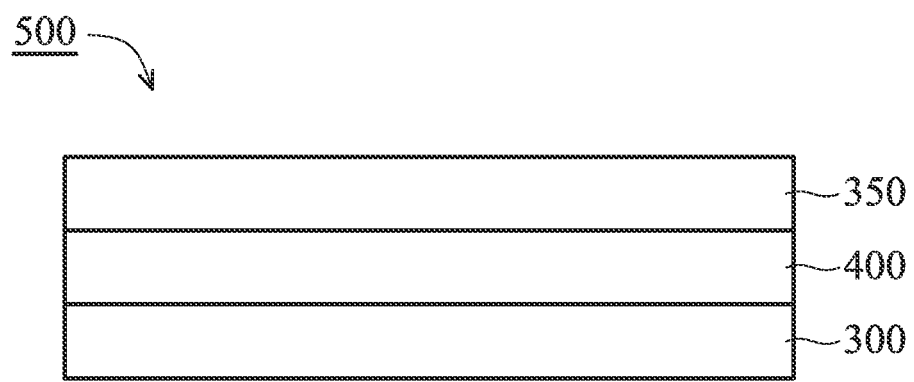
FIG. 13 is a schematic cross section showing a display device according to an embodiment of the invention.

FIG. 13 is a schematic cross section showing a display device 500 according to an embodiment of the invention.

As shown in FIG. 13, the display device 500 comprises an first substrate 300, a second substrate 350, and a display layer 400 disposed between the second substrate 350 and the first substrate 300. In one embodiment, the first substrate 300 of the display device may comprise the first substrates shown in FIGS. 7-12 and may further comprise other components such as pixel electrodes and common electrodes (not shown). According to various embodiments of the display device 500, such as a liquid-crystal display (LCD) device or an organic light-emitting diode (OLED) device, the display layer 400 may comprise a liquid-crystal layer or an organic light-emitting diode layer. According to various embodiments of the display device 500, such as a liquid-crystal display (LCD) device or an organic light-emitting diode (OLED) device, the second substrate 350 may comprise other components such as color filters (not shown), and the second substrate 350 may comprise transparent materials such as glass or plastic.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A display device, comprising:
    a first substrate;
    an insulating layer over the first substrate;
    a semiconductor layer over the insulating layer;
    a dielectric layer over the semiconductor layer, having an opening partially exposing the semiconductor layer and the insulating layer, wherein the opening has a first width along a first direction in a top view toward the first substrate;
    a data line over the dielectric layer and extending along a second direction that is different from the first direction and filling the opening, electrically connecting the semiconductor layer exposed by the opening, wherein the data line comprises a first portion over a top surface of the dielectric layer and a second portion in the opening, and the first portion of the data line has a second width along the first direction in a top view toward the first substrate, and the first width is greater than the second width;
    a second substrate; and
    a display layer disposed between the first substrate and the second substrate.

2. The display device as claimed in claim 1, wherein the first width is the maximum width of the opening.

3. The display device as claimed in claim 1, wherein the semiconductor layer has a third width along the first direction and the third width is greater than the second width but less than the first width.

4. The display device as claimed in claim 3, wherein the data line further comprises a third portion connecting with the first portion and the second portion, and the third portion is over the top surface of the dielectric layer and adjacent to the opening, and the third portion of the data line has a fourth width along the first direction, and the fourth width is less than the second width.

5. The display device as claimed in claim 1, wherein the second portion of the data line covers a top surface and a sidewall surface of the semiconductor layer exposed by the opening.

6. The display device as claimed in claim 1, wherein the semiconductor layer comprises polysilicon, amorphous silicon, or metal oxides.

7. The display device as claimed in claim 1, wherein the semiconductor layer has a U-like structure.

8. The display device as claimed in claim 1, wherein an edge of the semiconductor layer has a rounded corner structure.

9. The display device as claimed in claim 1, wherein the insulating layer is a buffer layer or a gate insulating layer.

10. The display device as claimed in claim 1, wherein the display layer is a liquid-crystal layer or an organic light-emitting diode layer.

11. The display device as claimed in claim 1, further comprising:
    a trench formed in the insulating layer, connecting with the opening; and
    wherein the data line is disposed over the opening and in the trench, covering the insulating layer exposed by the opening and the trench and partially covering a sidewall of the dielectric layer exposed by the opening.

12. The display device as claimed in claim 11, wherein a gap is formed between a top surface of the insulating layer exposed by the opening and a bottom surface of the trench.

13. The display device as claimed in claim 12, wherein the trench further comprises a connection surface for connecting the top surface of the insulating layer exposed by the opening and the bottom surface of the trench.

* * * * *